(12) United States Patent
Joe et al.

(10) Patent No.: US 7,855,908 B2
(45) Date of Patent: Dec. 21, 2010

(54) INFORMATION STORAGE DEVICES USING MAGNETIC DOMAIN WALL MOTION AND METHODS OF OPERATING THE SAME

(75) Inventors: In-sung Joe, Seoul (KR); Yoon-dong Park, Yongin-si (KR); Seung-hoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 349 days.

(21) Appl. No.: 12/213,856

(22) Filed: Jun. 25, 2008

(65) Prior Publication Data
US 2009/0207718 A1  Aug. 20, 2009

(30) Foreign Application Priority Data
Feb. 14, 2008  (KR) .................. 10-2008-0013490

(51) Int. Cl.
G11C 19/00  (2006.01)
(52) U.S. Cl. .................. 365/85; 365/80; 365/81
(58) Field of Classification Search ............ 365/85
See application file for complete search history.

(56) References Cited

U.S. PATENT DOCUMENTS

| | | | |
|---|---|---|---|
| 6,834,005 B1 | 12/2004 | Parkin | |
| 6,898,132 B2 * | 5/2005 | Parkin | 365/189.12 |
| 6,970,379 B2 * | 11/2005 | Parkin | 365/173 |
| 7,477,539 B2 * | 1/2009 | Kim et al. | 365/158 |
| 7,514,271 B2 * | 4/2009 | Gaidis et al. | 438/3 |
| 7,710,757 B2 * | 5/2010 | Kim et al. | 365/81 |
| 7,738,278 B2 * | 6/2010 | Kim et al. | 365/80 |
| 7,751,223 B2 * | 7/2010 | Kim et al. | 365/80 |
| 2007/0198618 A1 * | 8/2007 | Kim et al. | 708/130 |
| 2008/0080234 A1 * | 4/2008 | Iwata et al. | 365/171 |
| 2009/0097365 A1 * | 4/2009 | Lee et al. | 369/13.35 |
| 2009/0207643 A1 * | 8/2009 | Joe et al. | 365/85 |

* cited by examiner

Primary Examiner—Son L Mai
(74) Attorney, Agent, or Firm—Harness, Dickey & Pierce, P.L.C.

(57) ABSTRACT

An information storage device using magnetic domain wall motion and a method of operating the same are provided. The information storage device includes a magnetic track having a plurality of magnetic domains and magnetic domain walls arranged alternately. A current supply unit is configured to apply current to the magnetic track, and a plurality of reading/writing units are arranged on the magnetic track. The information storage device further includes a plurality of storage units. Each of the plurality of storage units is connected to a corresponding one of the plurality of reading/writing units for storing data temporarily.

25 Claims, 12 Drawing Sheets

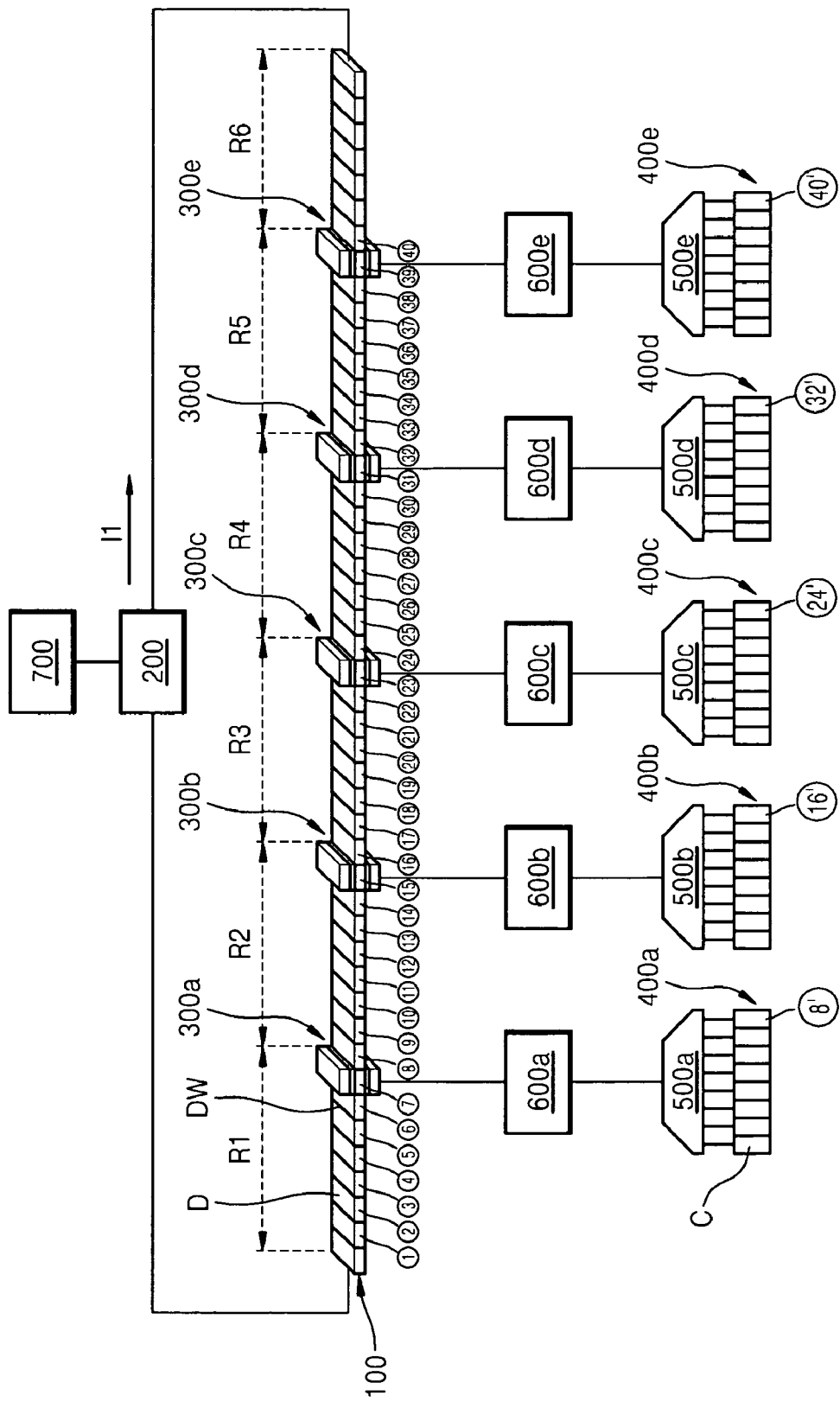

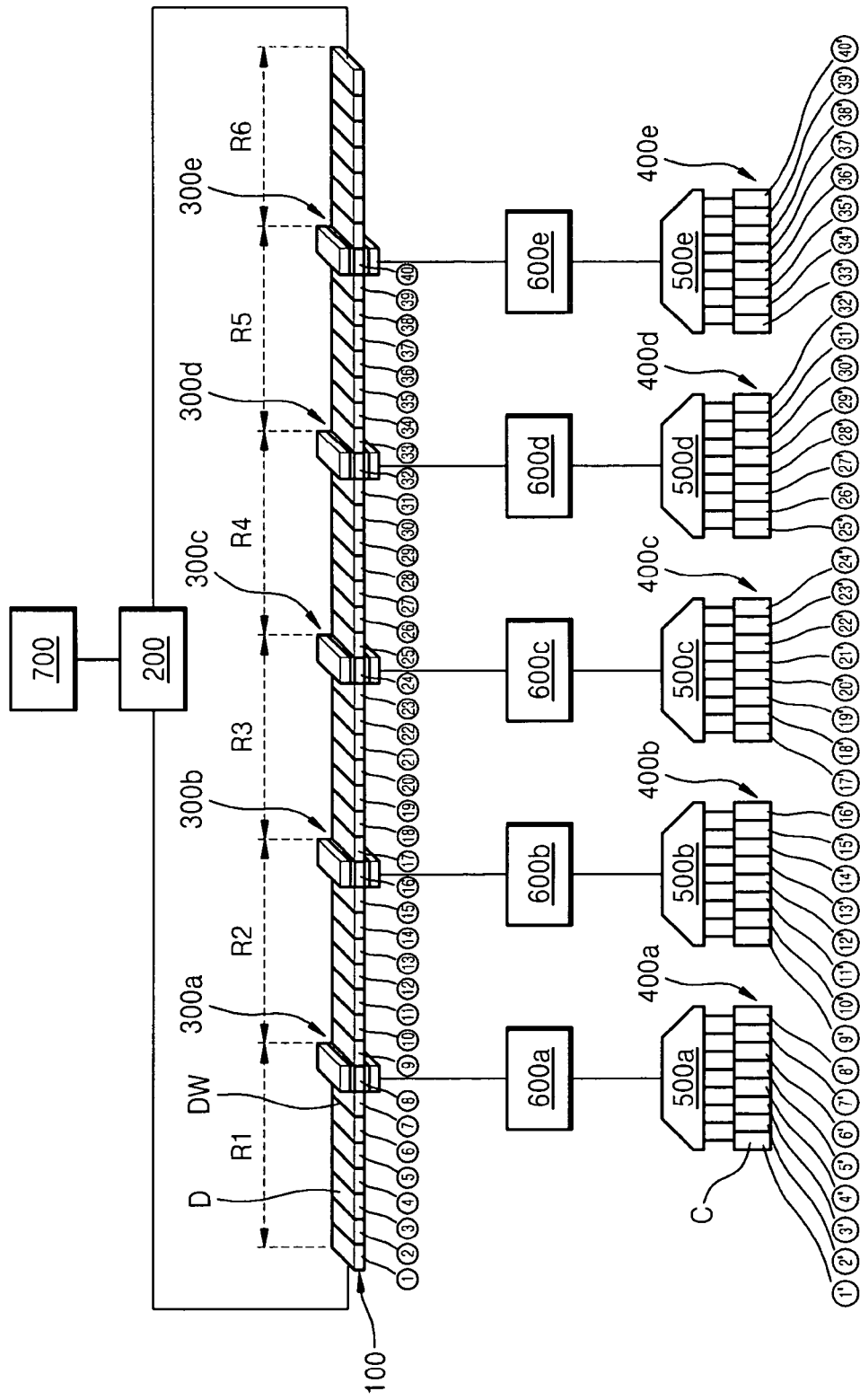

INFORMATION STORAGE DEVICES USING MAGNETIC DOMAIN WALL MOTION AND METHODS OF OPERATING THE SAME

PRIORITY STATEMENT

This non-provisional U.S. patent application claims priority under 35 U.S.C. §119 to Korean Patent Application No. 10-2008-0013490, filed on Feb. 14, 2008, in the Korean Intellectual Property Office, the disclosure of which is incorporated herein by reference in its entirety.

BACKGROUND

Description of the Related Art

Examples of conventional nonvolatile information storage devices in which recorded information is retained even when power is cut-off include hard disk drives (HDDs) and nonvolatile random access memories (RAMs).

Conventional HDDs use a rotating part to store information. But, the rotating part may wear down over time, thereby increasing the likelihood of operational failure; this reduces reliability.

An example of a conventional non-volatile RAM is a flash memory. While not using a rotating part, the flash memory has relatively slow reading and writing speeds, a relatively short life span, and relatively small storage capacities when compared to a conventional HDD. Flash memories may also have relatively high manufacturing costs.

Another conventional information storage device uses the principle of magnetic domain wall motion of a magnetic material. In these conventional magnetic information storage devices, a minute magnetic region that constitutes a ferromagnetic substance is referred to as a magnetic domain. A boundary portion between magnetic domains having different magnetization directions is referred to as a magnetic domain wall. The magnetic domains and the magnetic domain walls may be moved by applying current to a magnetic layer.

One example magnetic information storage device includes a U-shaped magnetic track arranged perpendicular to a substrate. The U-shaped magnetic track is divided into a storage region and a buffer region having a length similar to the length of the storage region. The conventional magnetic information storage device includes a writing unit and a reading unit arranged adjacent to a central portion of the U-shaped magnetic track. The U-shaped magnetic track includes a plurality of successive magnetic domains and magnetic domain walls each formed between the magnetic domains. Data is written or read by the writing unit or the reading unit, respectively, while moving the magnetic domains and the magnetic domain walls.

The U-shaped magnetic track may be formed of a soft magnetic material such as NiFe. Magnetic domain walls in the soft magnetic material may have a width as thick as hundreds of nanometers (nm). As a result, it may be relatively difficult to increase a recording density of conventional magnetic information storage devices. Further, moving of the magnetic domain walls of the soft magnetic layer requires current as high as about $10^{12}$ A/m², which increases power consumption in the conventional information storage device.

Moreover, an effective storage region of conventional magnetic information storage devices corresponds to about half of the U-shaped magnetic track. Accordingly, implementing a conventional information storage device having relatively high storage capacity may be relatively difficult.

SUMMARY

Example embodiments relate to information storage devices and methods of operating the same, for example, an information storage device using magnetic domain wall motion and a method of operating the same.

Example embodiments provide information storage devices using motion of magnetic domains and magnetic domain walls, and methods of operating the same.

According to at least one example embodiment, an information storage device includes a first magnetic track having a plurality of magnetic domains and magnetic domain walls arranged alternately. A current supply unit may apply current to the first magnetic track, and a plurality of reading/writing units may be arranged on the first magnetic track. The information storage device may further include a plurality of storage units. Each of the plurality of storage units may be connected to a corresponding one of the plurality of reading/writing units for temporarily storing data.

According to at least some example embodiments, the plurality of reading/writing units may be spaced apart at the same or substantially the same intervals. Each storage unit may include a selecting logic connected to each reading/writing unit and a memory device connected to each selecting logic. The information storage device may further include a signal converter arranged between each reading/writing unit and corresponding storage unit. The information storage device may further include a controller configured to store position information for the magnetic domains moved by the current supply unit.

According to at least some example embodiments, each reading/writing unit may include a first pinned ferromagnetic layer and a second pinned ferromagnetic layer. The first pinned ferromagnetic layer may be formed on a lower surface of the magnetic track. The second pinned ferromagnetic layer may be formed on an upper surface of the magnetic track. The first and second pinned ferromagnetic layers may have opposite magnetization directions. A first insulating spacer may be interposed between the first pinned ferromagnetic layer and the lower surface of the magnetic track. A second insulating spacer may be interposed between the second pinned ferromagnetic layer and the upper surface of the magnetic track.

According to at least some example embodiments, the information storage device may further include at least one second magnetic track having a plurality of magnetic domains and magnetic domain walls arranged alternately. A second plurality of reading/writing units may be arranged on each of the at least one second magnetic tracks. The current supply unit may be configured to apply current to each of the first and at least one second magnetic tracks.

At least one other example embodiment provides an information storage device including a plurality of magnetic tracks. A plurality of reading/writing units may be arranged on each of the plurality of magnetic tracks. Each of a plurality of storage units may be commonly connected to the reading/writing units arranged on at least two magnetic tracks. The current supply unit may be commonly connected to at least two magnetic tracks.

At least one other example embodiment provides a method for operating an information storage device. The information storage device may include a magnetic track having a plurality of magnetic domains and magnetic domain walls arranged alternately. The information storage device may include a current supply unit configured to apply current to the magnetic track, a plurality of reading/writing units arranged on the magnetic track, and a plurality of storage units. Each of the plurality of storage units may be connected to a corresponding one of the plurality of reading/writing units for temporarily storing data. The method may include applying current to at least one of the plurality of reading/writing units and the magnetic track.

According to at least some example embodiments, the current may be one of writing current, reading current, and current for moving the magnetic domains and magnetic domain walls. The plurality of reading/writing units may include N reading/writing units spaced apart at the same or substantially the same interval. The magnetic track may be divided into N+1 regions by the plurality of reading/writing units.

According to at least some example embodiments, the method may include performing first read operation or first write operation using the plurality of reading/writing units while moving magnetic domains in the first to N-th regions of the N+1 regions toward the second to (N+1)-th regions by the bit.

According to at least some example embodiments, a second read operation or second write operation may be performed using the plurality of reading/writing units while moving the magnetic domains from the second to (N+1)-th regions toward the first to N-th regions by the bit. In the first and second read operations, data read by the plurality of reading/writing units may be stored in the storage units corresponding to the respective reading/writing units. An order of data stored in the storage units by the first read operation may be the same or substantially the same as an order of data stored in the storage units by the second read operation.

According to at least some example embodiments, data to be written to the magnetic track may be stored in the storage unit prior to performing the first write operation. The first write operation may include sending a signal corresponding to the data stored in the storage unit to a corresponding reading/writing unit. The method may further include storing, in the storage unit, data to be written to the magnetic track prior to performing the second write operation. The second write operation may further include sending a signal corresponding to the data stored in the storage unit to a corresponding reading/writing unit.

According to at least some example embodiments, the storage unit may include a selecting logic connected to each reading/writing unit, and a memory device connected to each selecting logic. The information storage device may further include a plurality of signal converters. Each of the plurality of signal converters may be arranged between a reading/writing unit and a corresponding storage unit. The information storage device may further include a controller configured to store position information for the magnetic domains moved by the current supply unit. Each storage unit may be commonly connected to the reading/writing units arranged on at least two magnetic tracks. The current supply unit may be commonly connected to at least two magnetic tracks.

BRIEF DESCRIPTION OF THE DRAWINGS

Example embodiments will become more apparent by describing in detail the attached drawings in which:

FIGS. 4A through 4D are perspective views illustrating a method of operating an information storage device according to an example embodiment; and FIGS. 5A through 5E are perspective views illustrating a method for operating an information storage device according to another example embodiment.

DETAILED DESCRIPTION OF EXAMPLE EMBODIMENTS

Figure 1:
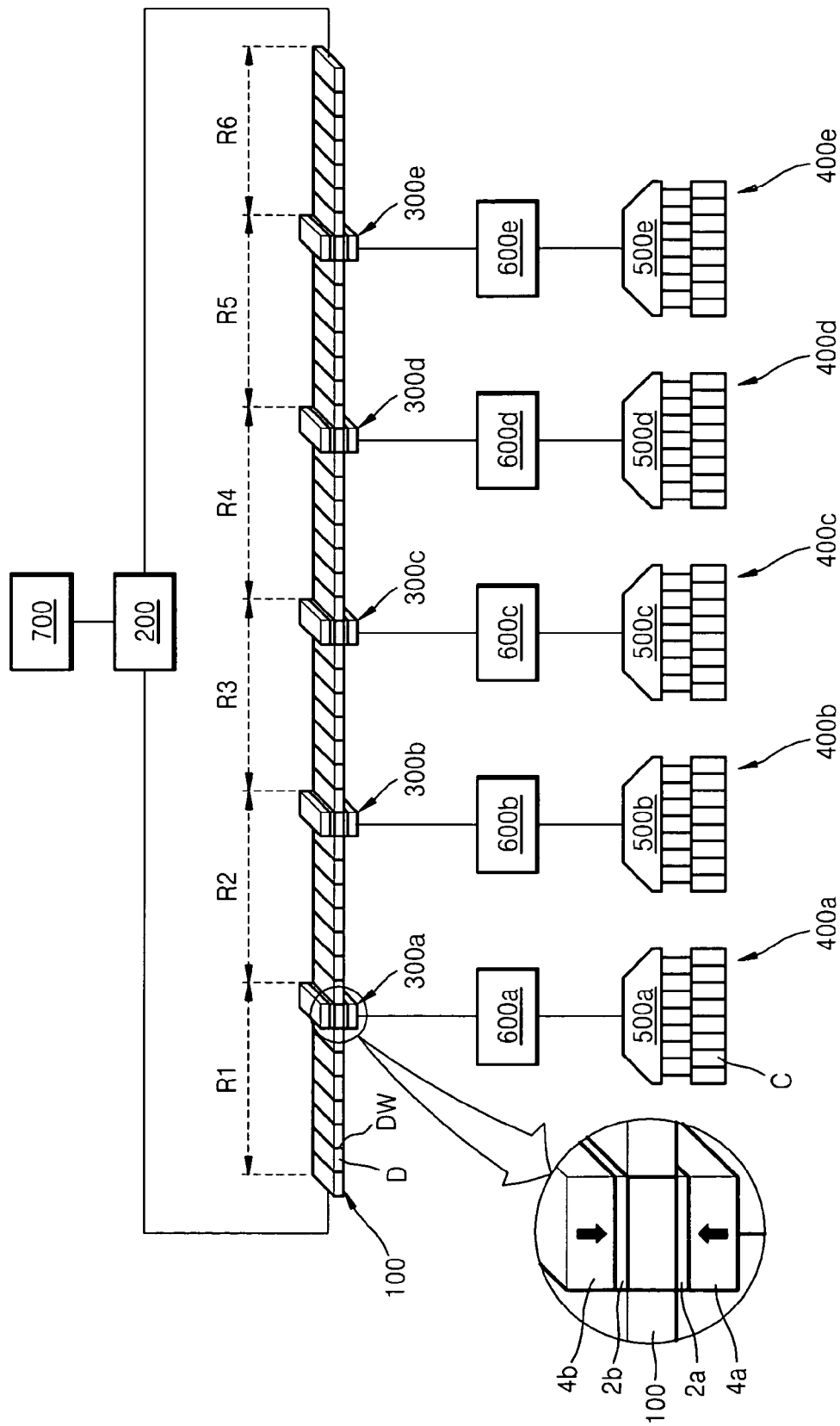
FIG. 1 is a perspective view illustrating an information storage device using magnetic domain wall motion according to an example embodiment.

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the thicknesses of layers and regions are exaggerated for clarity. Like reference numerals in the drawings denote like elements.

FIG. 1 illustrates an information storage device using magnetic domain wall motion according to an example embodiment.

Referring to FIG. 1, the information storage device according to an example embodiment may include a magnetic track 100 having a plurality of magnetic domains D and magnetic domain walls DW arranged between the magnetic domains D.

The magnetic track 100 may include a ferromagnetic material, for example a hard magnetic material, in parallel with a substrate (not shown). The ferromagnetic material may have a perpendicular magnetic anisotropy. The magnetic track 100 may be a multi-layered track.

The multi-layered track may include a first layer formed of, for example, at least one of Co, Co alloy and the like, and a second layer formed of at least one of Pt, Ni, Pd, an alloy thereof or the like. The first layer and the second layer may be stacked alternately. Alternatively, the magnetic track 100 may be a FePt layer or a CoPt layer having a $L1_0$ structure, or may be an alloy layer of a rare-earth element and a transition metal.

The magnetic track 100 may have a magnetic anisotropy energy density K of about $10^3 \leq K \leq 10^7$ J/m$^3$. The magnetic domain walls of the track formed of a hard magnetic material ("a hard magnetic track") may have a width as small as several through several tens of nanometers (nm). According to at least some example embodiments, a current density (e.g., about $10^{11}$ A/m$^2$ or less) required for moving the magnetic domain walls of the hard magnetic track is smaller than a current density (about $10^{12}$ A/m$^2$) required for moving the magnetic domain walls of the conventional soft magnetic track. Further, data written to the hard magnetic track may be more thermally stable than data written to the soft magnetic track. Thus, according to at least one example embodiment, an information storage device having a relatively high recording density, lower power consumption, and/or improved reliability may be realized.

The magnetic track 100 may be connected to a current supply unit 200. The current supply unit 200 may be connected to at least one (or both) end(s) of the magnetic track 100, and may generate pulse current. In one example, the current supply unit 200 may include a first current supply unit connected to an end of the magnetic track 100, and a second current supply unit connected to the other end of the magnetic track 100. The current supply unit 200 may apply current to the magnetic track 100 to move the magnetic domains D and the magnetic domain walls DW in a given or desired direction. The magnetic domains D and the magnetic domain walls DW move in a direction opposite to the flow of the current, in the direction of the electrons' motion.

The information storage device of FIG. 1 may further include a plurality of (e.g., N, where N is an integer) reading/writing units, for example, first to fifth reading/writing units 300a to 300e arranged on the magnetic track 100. A structure of the first to fifth reading/writing units 300a to 300e will be described in more detail later. The first to fifth reading/writing units 300a to 300e may be spaced apart at the same or substantially the same interval. The magnetic track 100 may be divided into a plurality of smaller regions ("a unit region"), for example, first to sixth regions R1 to R6 having similar or substantially similar lengths by the first to fifth reading/writing units 300a to 300e. An end region of the first to sixth regions R1 to R6 (e.g., the first or sixth region R1 or R6) may be used as a buffer region, while the others may be used as effective storage regions. The buffer region may have the same or substantially the same length as a unit region.

In one example embodiment, the information storage device may include N reading/writing units spaced apart by the same interval. The N reading/writing units may divide the magnetic track 100 into N+1 regions.

In an example read operation, data stored in the magnetic domains D of the first to fifth regions R1 to R5 may be read by moving the magnetic domains D and the magnetic domain walls DW toward the sixth region R6 by the interval between the reading/writing units 300a to 300e, for example, the length of a unit region. Similarly, in an example write operation, data may be written to five regions of the first to sixth regions R1 to R6 by the first to fifth reading/writing units 300a to 300e by moving the magnetic domains D and the magnetic domain walls DW by the length of a unit region.

When the magnetic track 100 is divided into, for example, six regions by the first to fifth reading/writing units 300a to 300e as shown in FIG. 1, the buffer region may have a length of about ⅙ of the length of the magnetic track 100. Because a buffer region of a conventional information storage device has about ½ of a physical storage capacity of the magnetic track, the buffer region in information storage devices according to example embodiments may be smaller than that of the conventional information storage device. The increase in the number of reading/writing units may reduce length of the buffer region, which enables information storage devices according to example embodiments to have a smaller buffer region than conventional information storage devices. Thus, information storage devices according to example embodiments may have increased capacity.

At least one storage unit may be connected to each of the first to fifth reading/writing units 300a to 300e. Each storage unit may include one of a plurality of (e.g., first to fifth) memory devices 400a to 400e. Each of the memory devices 400a to 400e may be connected to one of the first to fifth reading/writing units 300a to 300e. Each storage unit may further include one of a plurality of (e.g., first to fifth) selecting logics 500a to 500e. Each selecting logic 500a to 500e may be located between one of the first to fifth memory devices 400a to 400e and a corresponding one of the first to fifth reading/writing units 300a to 300e. The first to fifth memory devices 400a to 400e may temporarily store data. In one example, the first to fifth memory devices 400a to 400e may be cache memories having, for example, a static RAM (SRAM) structure. Each of the memory devices 400a to 400e may temporarily store data read by a corresponding one of the reading/writing units 300a to 300e or data to be written to the magnetic track 100. Each of the memory devices 400a to 400e may include a plurality of memory cells C. The number of memory cells C may be the same or substantially the same as the number of magnetic domains D of the first to fifth regions R1 to R5.

Each of the selecting logics 500a to 500e may control an order of data input to a corresponding one of the first to fifth memory devices 400a to 400e and/or data output from the first to fifth memory devices 400a to 400e. For example, each of the first to fifth selecting logics 500a to 500e may control an order of data input from a corresponding one of the first to fifth reading/writing units 300a to 300e to a corresponding one of the first to fifth memory devices 400a to 400e. Each of the first to fifth selecting logics 500a to 500e may also control and an order of data input from a corresponding one of the first to fifth memory devices 400a to 400e to a corresponding one of the first to fifth reading/writing units 300a to 300e. The first to fifth selecting logics 500a to 500e may have a multiplexer (MUX)/demultiplexer (DeMUX) structure, which is well known. Accordingly, a detailed description of the MUX/DeMUX structure will be omitted.

One of the first to fifth signal converters 600a to 600e may be provided between each reading/writing unit 300a to 300e and corresponding storage unit. For example, each of the first to fifth signal converters 600a to 600e may be arranged between one of the first to fifth reading/writing units 300a to 300e and a corresponding one of the first to fifth selecting logics 500a to 500e. Each of the first to fifth signal converters 600a to 600e may include a sense amplifier, which is well known in the field of semiconductor devices.

In an example read operation, an electrical signal, for example, a current signal output from at least one of the first to fifth reading/writing units 300a to 300e may be converted/amplified into a digital signal (e.g., a voltage signal) by corresponding ones of the first to fifth signal converters 600a to 600e, and sent to the first to fifth selecting logics 500a to 500e.

In an example write operation, an electrical signal (e.g., a voltage signal) output from at least one of the first to fifth memory devices 400a to 400e may be converted to another electrical signal (e.g., a current signal) by a corresponding one of the first to fifth signal converters 600a to 600e, and sent to a corresponding one of the first to fifth reading/writing units 300a to 300e.

Although the first to fifth signal converters 600a to 600e are shown in FIG. 1 as being connected to a lower portion of the first to fifth reading/writing units 300a to 300e (e.g., the first ferromagnetic layer 4a), they may be connected to at least one of the lower portion and an upper portion of the first to fifth reading/writing units 300a to 300e (e.g., at least one of the first and second ferromagnetic layers 4a and 4b).

Information storage devices according to at least this example embodiment may further include a controller 700 connected to the current supply unit 200. The controller 700 may store information regarding where or how far the magnetic domains D have been moved by the current supply unit 200. For example, the controller 700 may store position information of the magnetic domains D. The controller 700 may also control the current supply unit 200. In one example, the controller 700 may include a counter for counting the number of current pulses applied to the magnetic track 100 by the current supply unit 200. The controller 700 may also have an address mapping function. Because the address mapping functions are well known, a detailed description thereof will be omitted.

Referring to a partially expanded portion of FIG. 1, the first to fifth reading/writing units 300a to 300e may include first and second ferromagnetic layers 4a and 4b. The first ferromagnetic layer 4a may be formed on a lower surface of the magnetic track 100, whereas the second ferromagnetic layer 4b may be formed on an upper surface of the magnetic track 100. The first and second ferromagnetic layers 4a and 4b may be pinned ferromagnetic layers having opposite magnetization directions. In the first and second ferromagnetic layers 4a and 4b, arrows indicate the magnetization directions. The first to fifth reading/writing units 300a to 300e may further include first and second insulating spacers 2a and 2b. The first insulating spacer 2a may be interposed between the first ferromagnetic layer 4a and the magnetic track 100. The second insulating spacer 2b may be interposed between the second ferromagnetic layer 4b and the magnetic track 100. The first and second insulating spacers 2a and 2b may be oxide layers formed to a relatively small thickness, for example, a thickness that allows electron tunneling to occur.

A principle of writing data using the reading/writing units 300a to 300e according to an example embodiment will now be described with reference to FIGS. 2A and 2B.

Figure 2A:
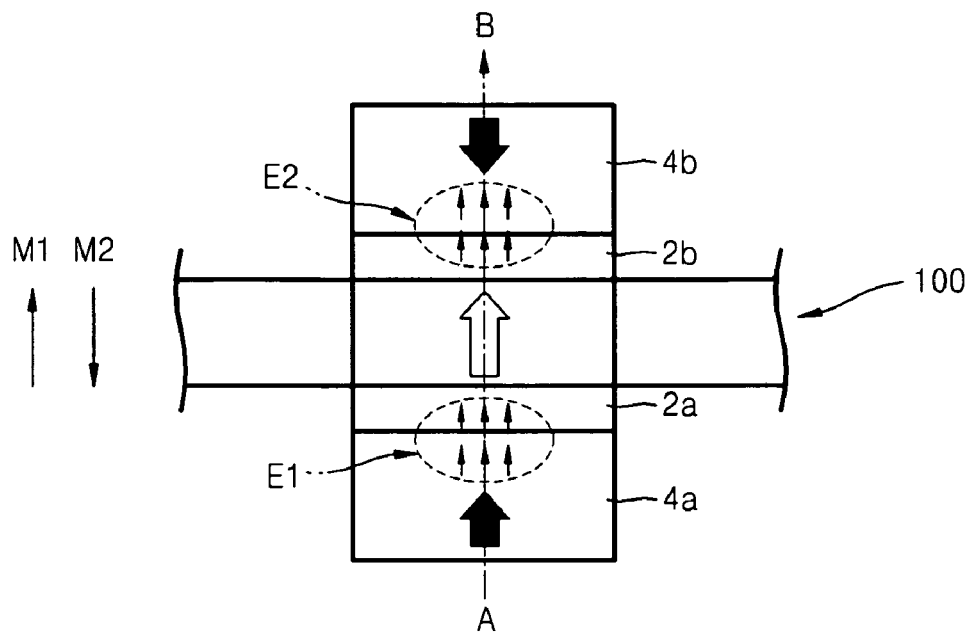
FIGS. 2A and 2B are cross-sectional views illustrating a method for writing data using a reading/writing unit for the information storage device according to an example embodiment.

Referring to FIG. 2A, when electrons move from the first ferromagnetic layer 4a to the second ferromagnetic layer 4b, for example, from A to B, electrons E1 having the same magnetization direction M1 ("a first direction") as the first ferromagnetic layer 4a move to the magnetic track 100. The electrons E1 serve to magnetize the magnetic track 100 in the first direction M1. This is referred to as a spin transfer torque effect.

In the second ferromagnetic layer 4b, electrons having the same magnetization direction M2 ("a second direction") as the second ferromagnetic layer 4b may exit the second ferromagnetic layer 4b while electrons E2 having an opposite magnetization direction from the second ferromagnetic layer 4b may not exit the second ferromagnetic layer 4b, but return to the magnetic track 100 to be accumulated. The electrons E2 serve to magnetize the magnetic track 100 in the first direction M1. This is referred to as a spin accumulation effect.

In this example, first data may be written to the magnetic track 100 by the spin transfer torque effect and the spin accumulation effect.

Figure 2B:
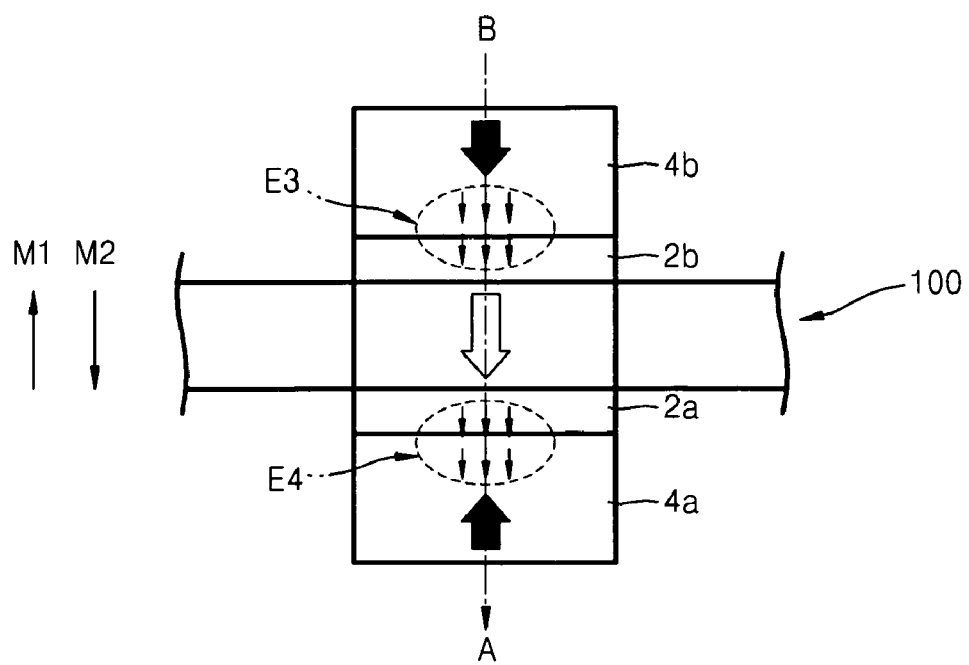

Referring to FIG. 2B, when electrons move from the second ferromagnetic layer 4b to the first ferromagnetic layer 4a, for example, from B to A, electrons E3 magnetized in the second direction M2 move to the magnetic track 100. The electrons E3 may magnetize the magnetic track 100 in the second direction M2. In the first ferromagnetic layer 4a, electrons magnetized in the first direction M1 may exit the first ferromagnetic layer 4a while electrons E4 magnetized in the second direction M2 may not exit the first ferromagnetic layer 4a, but return to the magnetic track 100 to be accumulated. The electrons E4 may magnetize the magnetic track 100 in the second direction M2. Accordingly, second data may be written to the magnetic track 100.

As described above, because information storage devices according at least this example embodiment include first and second ferromagnetic layers 4a and 4b arranged on the lower and upper surfaces of the magnetic track 100, respectively, and are magnetized in an opposite direction, data may be written by the spin transfer torque effect and the spin accumulation effect. This may reduce a writing current density as compared to use of a single pinned ferromagnetic layer. Writing methods according to example embodiments may be used to write data to the magnetic track 100 while moving the magnetic domains D and the magnetic domain walls DW by the bit.

A method of reading data according to example embodiments will now be described. The methods may be implemented using the reading/writing units 300a to 300e.

Referring back to FIG. 1, electric resistance between any one of the first ferromagnetic layer 4a and the second ferromagnetic layer 4b of the first reading/writing unit 300a and either end of the magnetic track 100 is measured. The electric resistance depends on data written to the magnetic track 100 having the first reading/writing unit 300a. Accordingly, the data written to the magnetic track 100 having the first reading/writing unit 300a may be identified by measuring the electric resistance. This reading principle may be used to reproduce the data written to the magnetic track 100 while moving the magnetic domains D and the magnetic domain walls DW by the bit.

Instead of measurement of the electric resistance between any one of the first ferromagnetic layer 4a and the second ferromagnetic layer 4b and either end of the magnetic track 100, electric resistance between the first ferromagnetic layer 4a and second ferromagnetic layer 4b may be measured to identify the data written to the magnetic track 100. In this example, because the current for data identification (e.g., data reading operation) is smaller than that for data writing operation, the data written to the magnetic track 100 may remain unchanged in the read operation. The same or substantially the same may apply to use of the second to fifth reading/writing units 300b to 300e.

Additionally, when current is applied to the magnetic track 100 to move the magnetic domains D and the magnetic domain walls DW, the first and second insulating spacers 2a and 2b may act as electrical barriers, which may suppress and/or prevent the current for moving the magnetic domain walls DW from leaking toward the first and second ferromagnetic layers 4a and 4b. The structure and principle of the reading/writing units 300a to 300e according to example embodiments disclosed herein is only an example and various variations thereof may be made.

Information storage devices according to example embodiments may include a plurality of magnetic tracks equivalent to the magnetic track 100 of FIG. 1. In at least one example embodiment, a plurality of reading/writing units 300a to 300e of FIG. 1 may be disposed on each of the plurality of magnetic tracks. The first to fifth memory devices 400a to 400e, the first to fifth selecting logics 500a to 500e, and the first to fifth signal converters 600a to 600e may be commonly connected to the plurality of magnetic tracks. An example of this structure is shown in FIG. 3.

Figure 3:
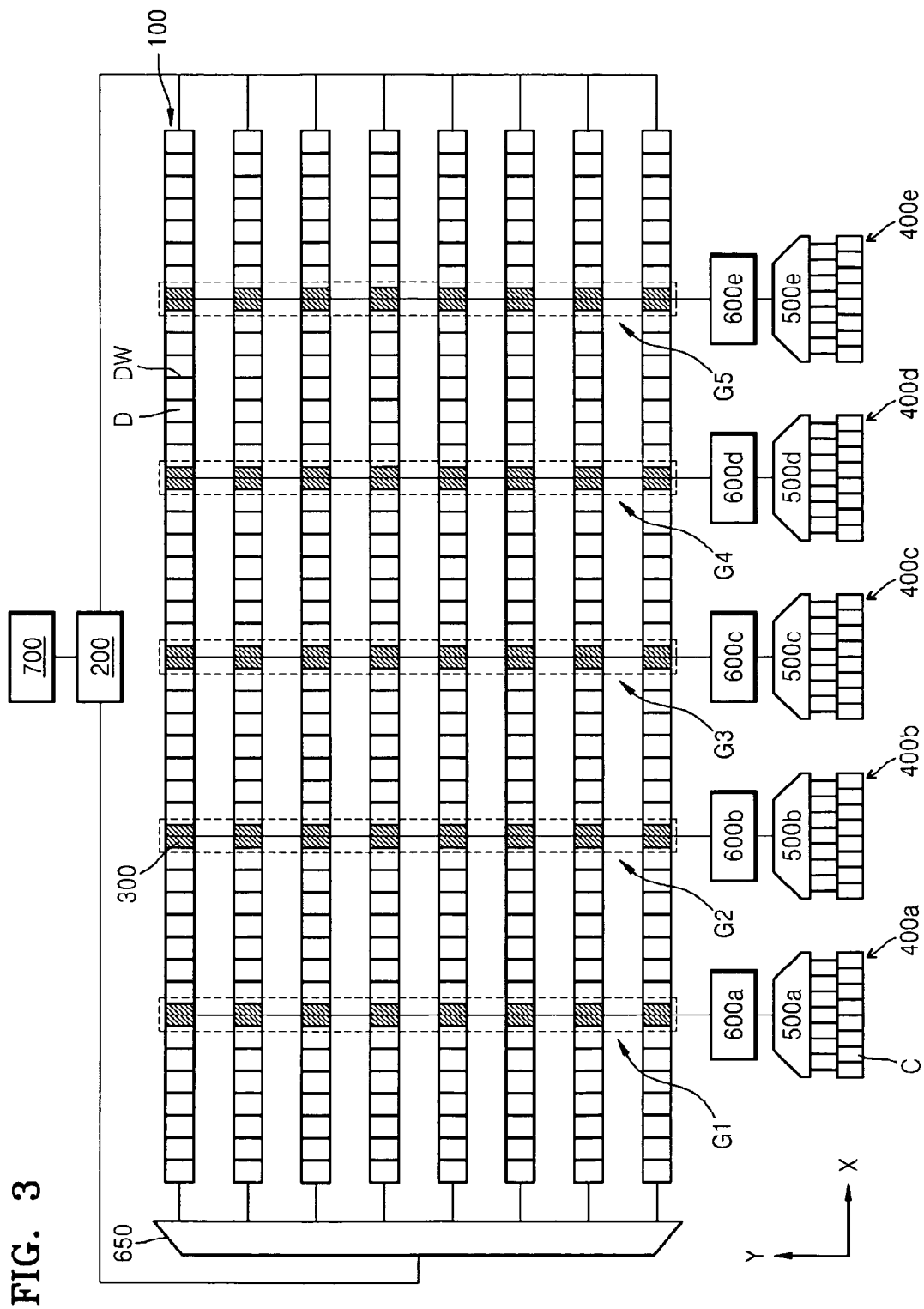
FIG. 3 is a plan view illustrating an information storage device using magnetic domain wall motion according to another example embodiment.

Referring to FIG. 3, a plurality of reading/writing units 300 may be arranged on each of the plurality of magnetic tracks 100. The plurality of magnetic tracks 100 may be arranged in parallel with one another. The plurality of magnetic tracks 100 may be in a linear form extending in an X-axis direction (e.g., horizontal), and the plurality of reading/writing units 300 may be regularly arranged in the X-axis and Y-axis (vertical) directions to form a plurality of rows and columns. In this example, eight rows and five columns are shown, but the number of the rows and columns may be changed.

Both ends of each of the plurality of magnetic tracks 100 may be commonly connected to the current supply unit 200. A switching device 650 may be located between the plurality of magnetic tracks 100 and the current supply unit 200. The switching device 650 may be referred to as a row decoder and have a DeMUX structure. The switching device 650 may be used to select at least one of the plurality of magnetic tracks 100 to which current for moving the magnetic domain walls DW is applied. The switching device 650 may select the magnetic track based on an input address signal. Although the switching device 650 is shown in FIG. 3 as being located at the left of the plurality of the magnetic tracks 100, it may be located at the right of the plurality of the magnetic tracks 100 or at both the left and right of the plurality of the magnetic tracks 100.

A controller 700 may be connected to the current supply unit 200. The controller 700 may store position information regarding where and how far the magnetic domains D have moved in the plurality of magnetic tracks 100. The controller 700 may also control the current supply unit 200. Although not shown, the controller 700 may be connected to the switching device 650 for inputting the address signal to the switching device 650.

If the reading/writing units in the same column in the Y-axis direction are grouped into first to fifth reading/writing unit groups G1 to G5, the first to fifth reading/writing unit groups G1 to G5 may be commonly connected to the first to fifth memory devices 400a to 400e. Each of the fifth signal converters 600a to 600e and the first to fifth selecting logics 500a to 500e may be arranged between one of the first to fifth reading/writing unit groups G1 to G5 and a corresponding one of the first to fifth memory devices 400a to 400e. The first to fifth memory devices 400a to 400e, the first to fifth selecting logics 500a to 500e, and the first to fifth signal converters 600a to 600e may be relatively small and commonly connected to the plurality of magnetic tracks 100. The first to fifth memory devices 400a to 400e, the first to fifth selecting logics 500a to 500e, and the first to fifth signal converters 600a to 600e may be arranged in a peripheral circuit region, which may not substantially affect the recording density of the information storage device.

Although not shown, another switching device may be arranged between each of the first to fifth signal converters 600a to 600e and a corresponding one of the first to fifth reading/writing unit groups G1 to G5. This switching device may be used to select a magnetic track on which read or write operation may be performed, from among the plurality of magnetic tracks 100.

A method for operating an information storage device using magnetic domain wall motion according to an example embodiment will now be described.

FIGS. 4A through 4D illustrate a method of reading data in an information storage device according to an example embodiment. The example embodiment uses the structure of FIG. 1, but may be applicable to other information storage devices.

Figure 4A:
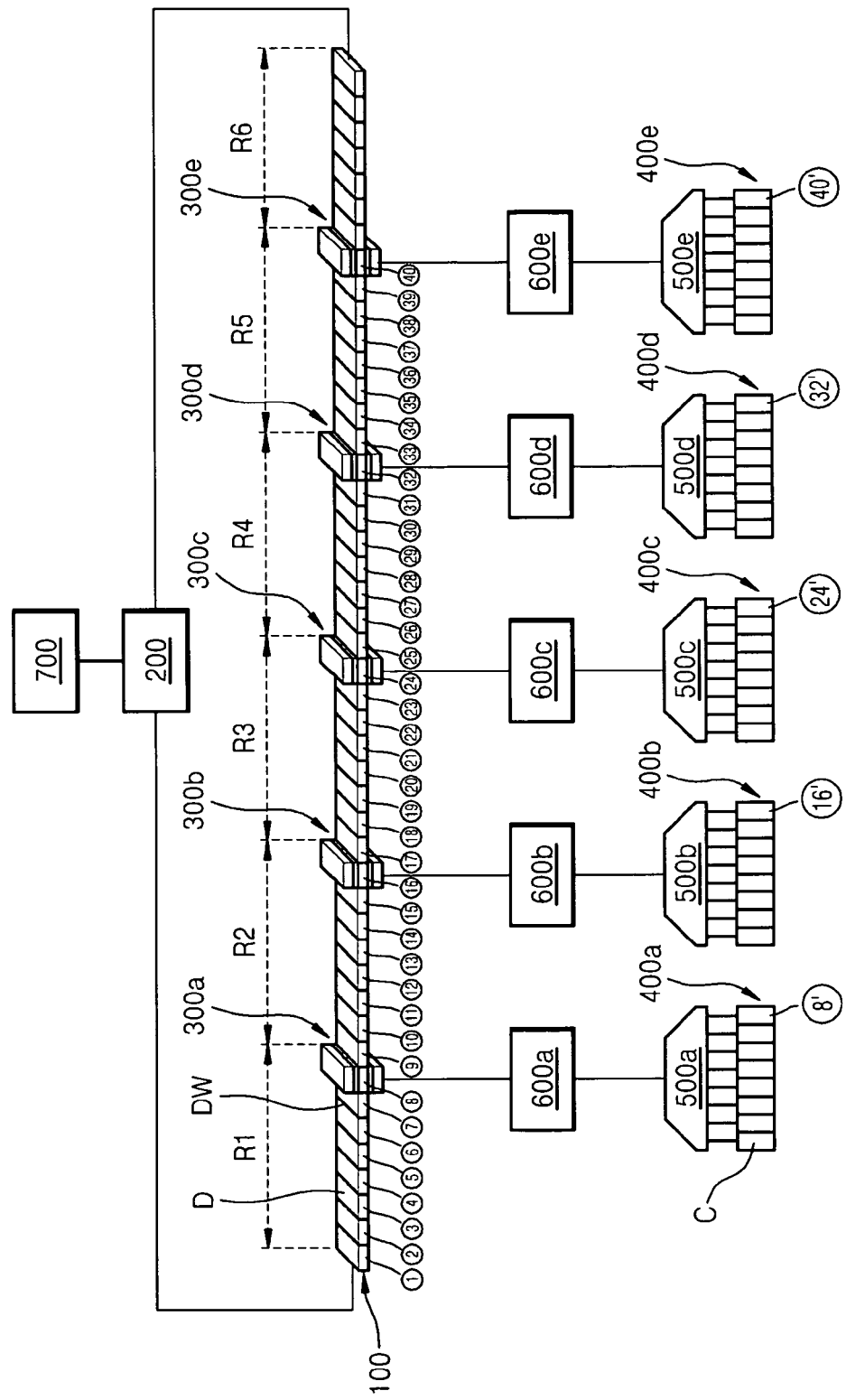

FIG. 4A illustrates an information storage device in a state where multi-bit (e.g., first to fortieth data) 1 to 40 are written to the magnetic domains D of the first to fifth regions R1 to R5. Reading currents may be applied to the first to fifth reading/writing units 300a to 300e to read data written in the magnetic track 100 on which the first to fifth reading/writing units 300a to 300e are provided. For example, reading currents may be applied to the first to fifth reading/writing units 300a to 300e to read eighth, sixteenth, 24th, 32nd and fortieth data 8, 16, 24, 32, and 40. In this example, the reading current may be applied between the first and second ferromagnetic layers 4a and 4b of each of the first to fifth reading/writing units 300a to 300e or between the first to fifth reading/writing units 300a to 300e and the magnetic track 100. The read data 8, 16, 24, 32, and 40 may be stored in the memory cells C of the first to fifth memory devices 400a to 400e. In this example, the memory cells C in which the read data 8, 16, 24, 32, and 40 may be stored may be determined by the first to fifth selecting logics 500a to 500e. For example, the read data 8, 16, 24, 32, and 40 may be stored in rightmost memory cells C of the first to fifth memory devices 400a to 400e. Reference numerals 8', 16', 24', 32' and 40' refer to data stored in the first to fifth memory devices 400a to 400e and correspond to the data 8, 16, 24, 32, and 40 read from the magnetic tracks 100.

Referring to FIG. 4B, a pulse current I1 may be applied by the current supply unit 200 to the magnetic track 100 to move the magnetic domains D and the magnetic domain walls DW toward the sixth region R6 by one bit in the magnetic track 100. Accordingly, the seventh, fifteenth, 23rd, 31st, and 39th data 7, 15, 23, 31, and 39 may be located at regions of the magnetic track 100 on which the first to fifth reading/writing units 300a to 300e are arranged.

Figure 4C:
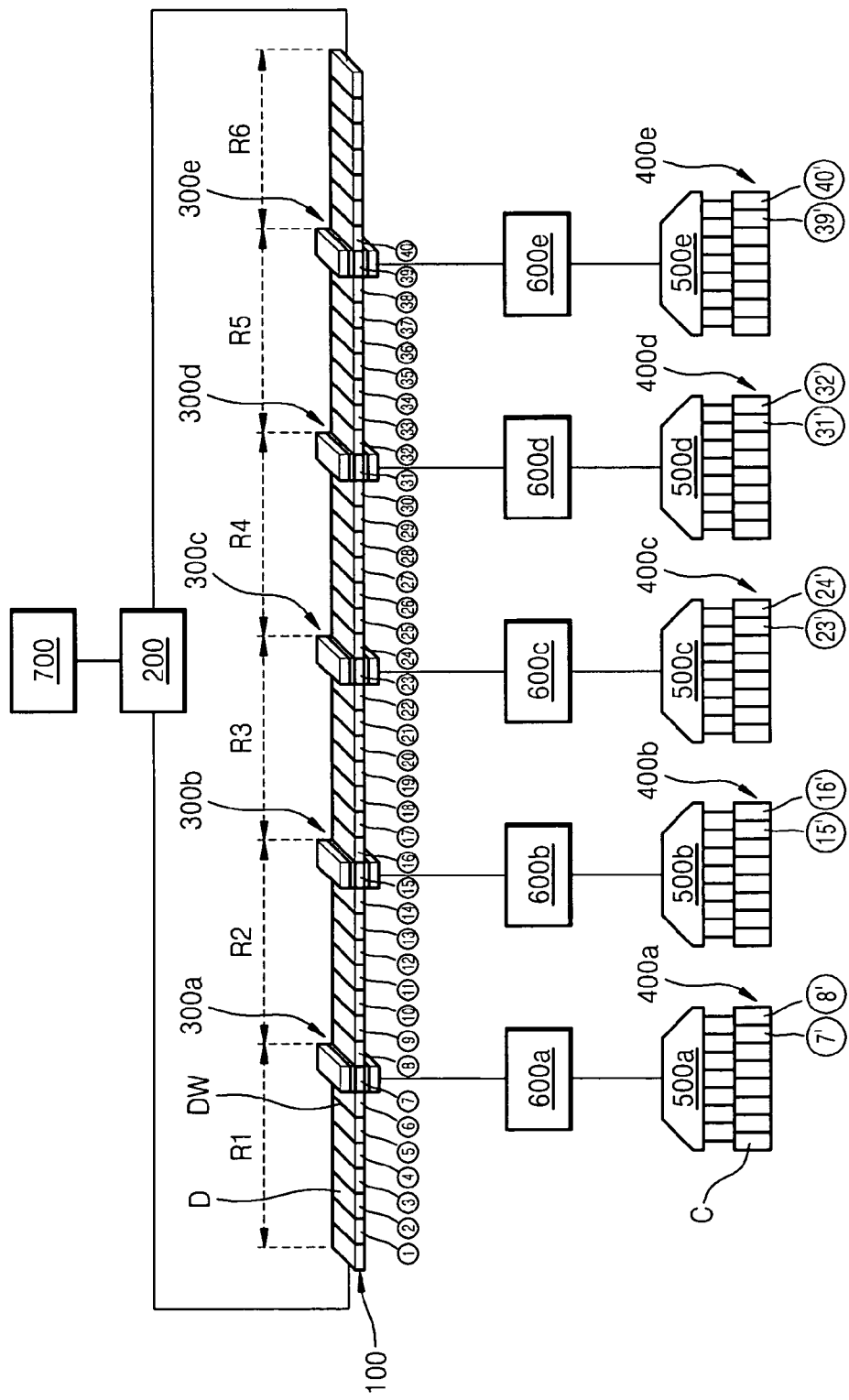

Referring to FIG. 4C, the seventh, fifteenth, 23rd, 31st, and 39th data 7, 15, 23, 31, and 39 may be read by the first to fifth reading/writing units 300a to 300e and stored in the first to fifth memory devices 400a to 400e. In this example, the read data 7, 15, 23, 31, and 39 may be stored in the second right memory cells C of the first to fifth memory devices 400a to 400e. Reference numerals 7', 15', 23', 31' and 39' refer to data stored in the first to fifth memory devices 400a to 400e, and correspond to the read data 7, 15, 23, 31, and 39.

Figure 4D:
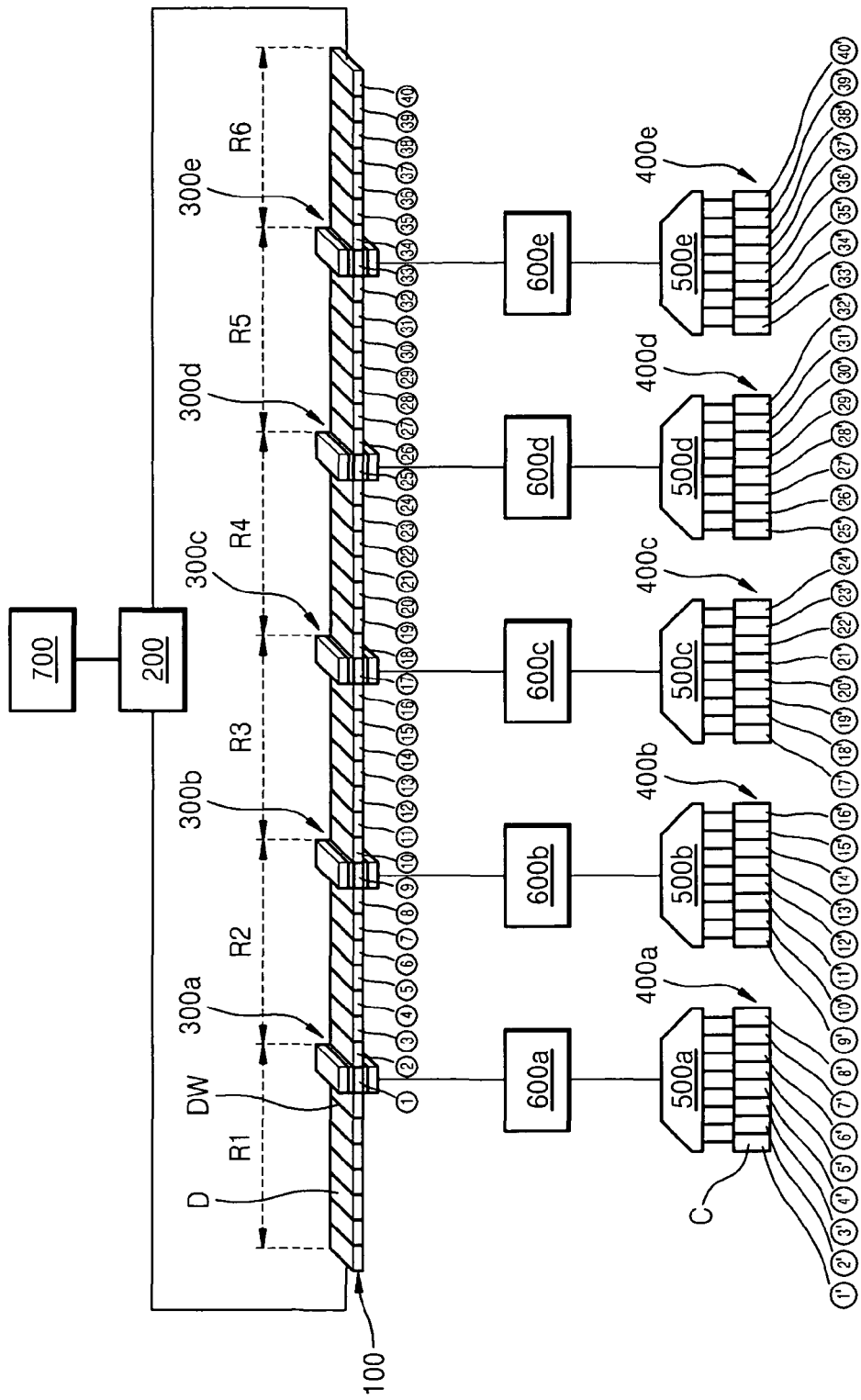

The motion of the magnetic domain wall and the read operation as described with reference to FIGS. 4B and 4C may be performed repeatedly. An example result is shown in FIG. 4D. Referring to FIG. 4D, the first, ninth, seventeenth, 25th, and 33rd data 1, 9, 17, 25, and 33 may be located in regions of the magnetic track 100 on which the first to fifth reading/writing units 300a to 300e are arranged, and the first to eighth data 1' to 8', the ninth to sixteenth data 9' to 16', the seventeenth to 24th data 17' to 24', the 25th to 32nd data 25' to 32', and the 33rd to fortieth data 33' to 40' may be stored in the first to fifth memory devices 400a to 400e sequentially from the left side. In this example, the first to fortieth data 1' to 40' stored in the first to fifth memory devices 400a to 400e correspond to the first to fortieth data 1 to 40 stored in the magnetic track 100.

FIGS. 5A through 5E illustrate a method of reading data in an information storage device according to another example embodiment.

Figure 5A:
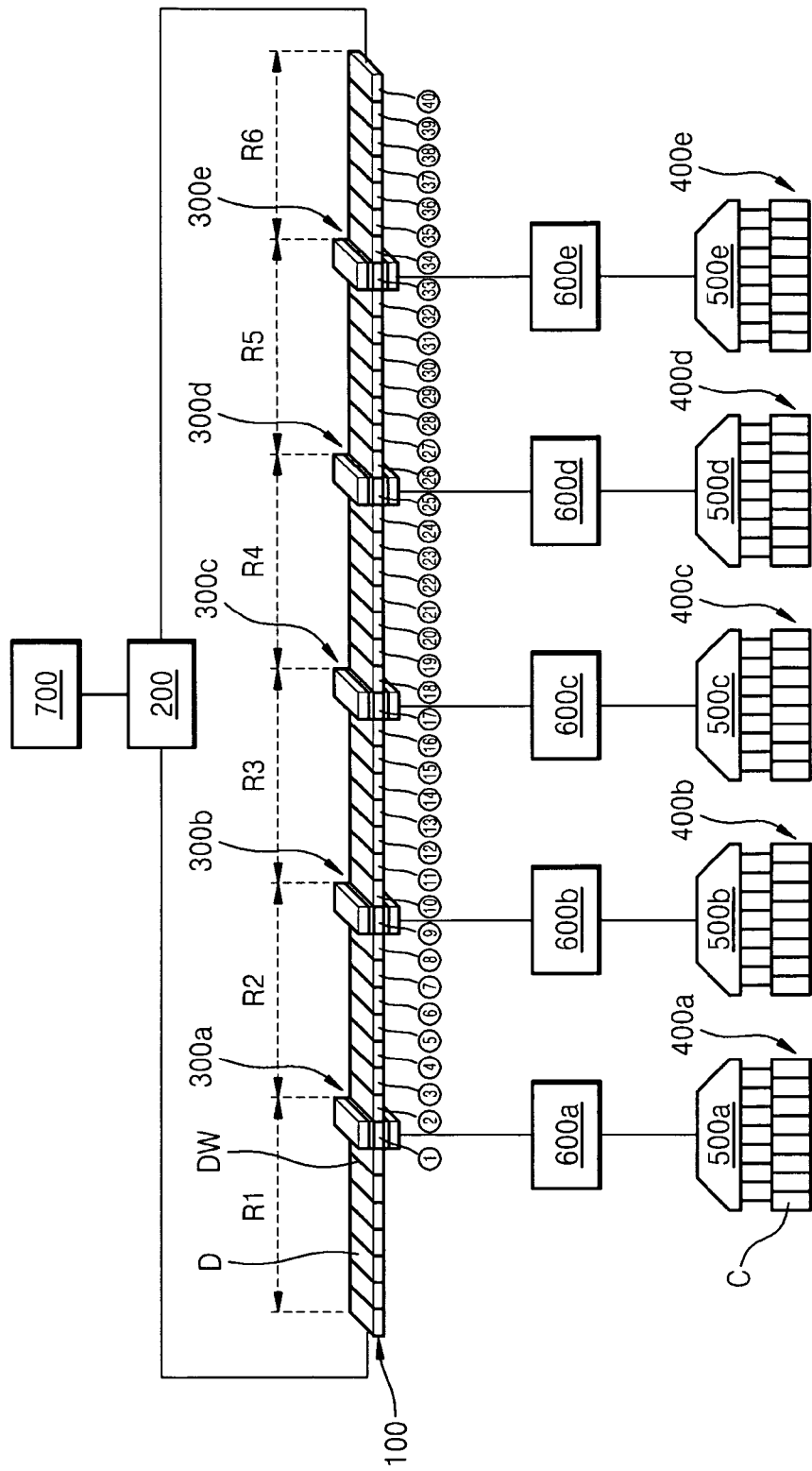

The structure of FIG. 5A may be the same or substantially the same as that of FIG. 4D except that data is not stored in the first to fifth memory devices 400a to 400e. However, data may also be stored in the first to fifth memory devices 400a to 400e of FIG. 5A.

Figure 5B:
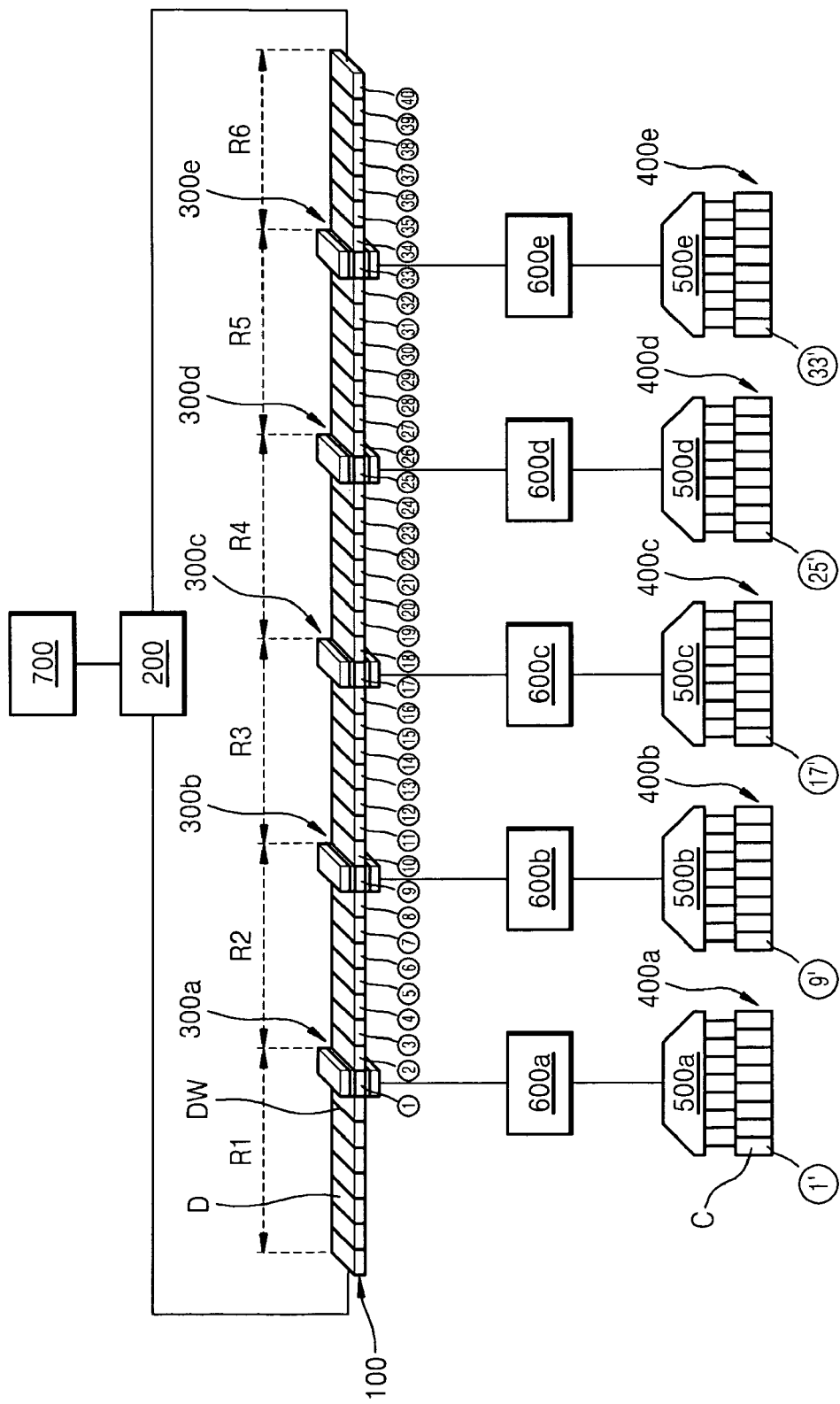

Referring to FIG. 5B, reading currents may be applied to the first to fifth reading/writing units 300a to 300e to read data written in regions of the magnetic track 100 on which the first to fifth reading/writing units 300a to 300e are arranged, for example, first, ninth, seventeenth, 25th, and 33rd data 1, 9, 17, 25, and 33. The read data 1, 9, 17, 25, and 33 may be stored in memory cells C of the first to fifth memory devices 400a to 400e. In this example, the read data 1, 9, 17, 25, and 33 may be stored in leftmost memory cells C of the first to fifth memory devices 400a to 400e. Reference numerals 1', 9', 17', 25' and 33' refer to data stored in the first to fifth memory devices 400a to 400e and correspond to the data 1, 9, 17, 25, and 33 read from the magnetic track 100.

Figure 5C:
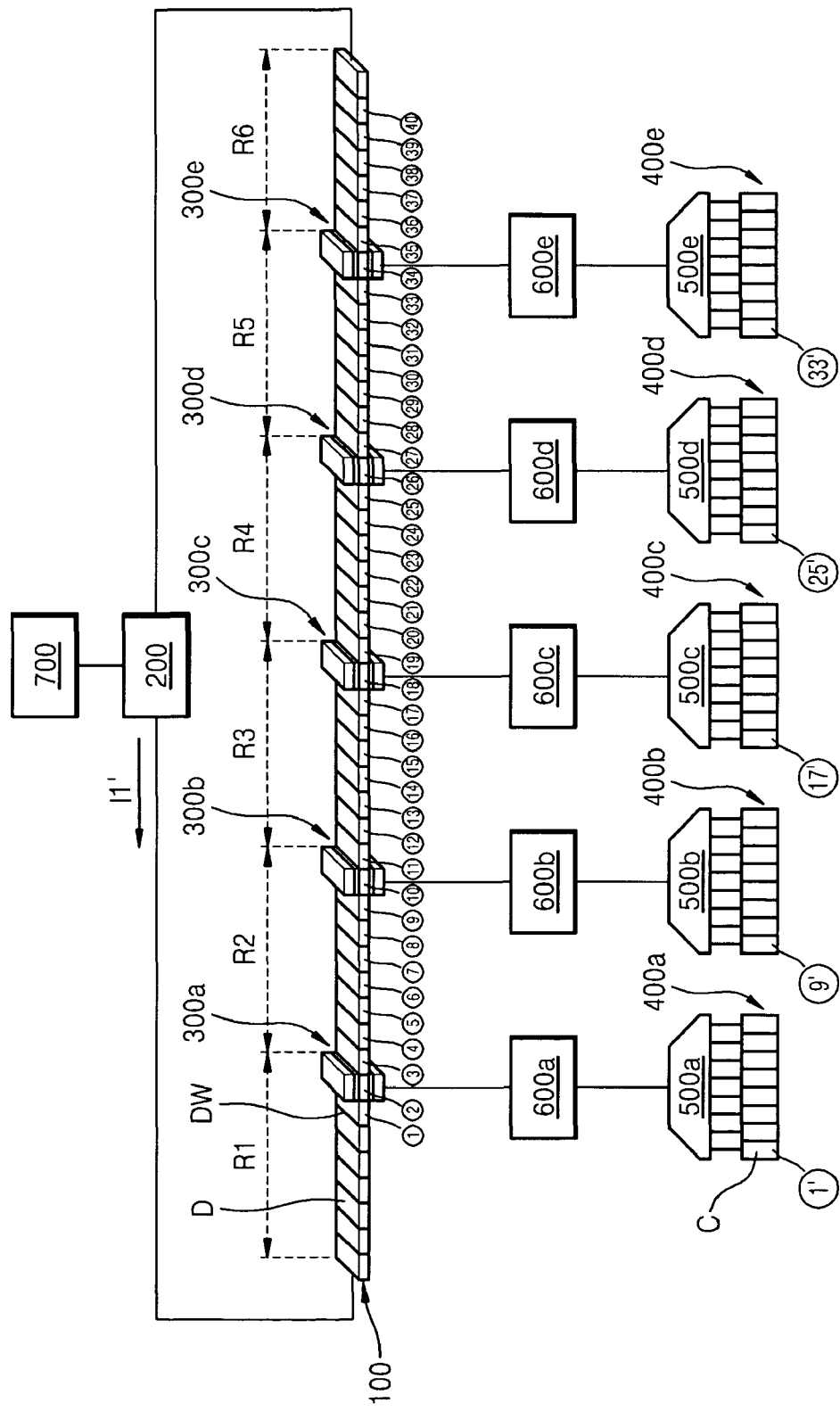

Referring to FIG. 5C, a pulse current I1' may be applied by the current supply unit 200 to the magnetic track 100 to move the magnetic domains D and the magnetic domain walls DW toward the first region R1 by one bit in the magnetic track 100. Accordingly, the second, tenth, eighteenth, 26th, and 34th data 2, 10, 18, 26, and 34 may be located at regions of the magnetic track 100 on which the first to fifth reading/writing units 300a to 300e are arranged.

Figure 5D:
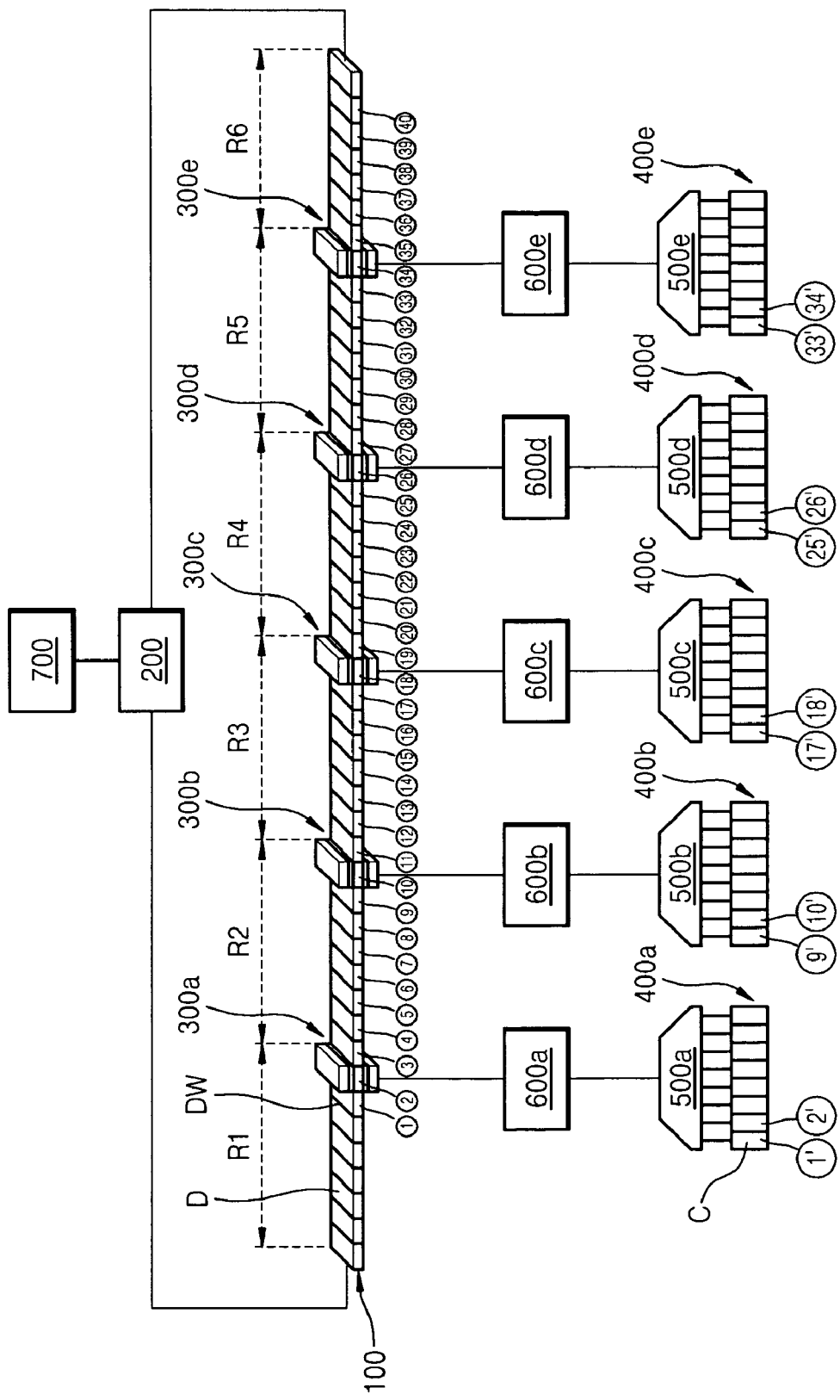

Referring to FIG. 5D, the first to fifth reading/writing units 300a to 300e may read the second, tenth, eighteenth, 26th, and 34th data 2, 10, 18, 26, and 34 and store the same in the first to fifth memory devices 400a to 400e. In this example, the read data 2, 10, 18, 26, and 34 may be stored in the second left memory cells C of the first to fifth memory devices 400a to 400e. The reference numerals 2', 10', 18', 26' and 34' refer to data stored in the first to fifth memory devices 400a to 400e and correspond to the data 2, 10, 18, 26, and 34 read from the magnetic track 100, respectively.

The motion of the magnetic domain walls and the read operation as described with reference to FIGS. 5C and 5D may be performed repeatedly. An example result is shown in FIG. 5E. Referring to FIG. 5E, the eighth, sixteenth, 24th, 32nd, and fortieth data 8, 16, 24, 32, and 40 may be located at regions of the magnetic track 100 on which the first to fifth reading/writing units 300a to 300e are arranged. The first to eighth data 1' to 8', the ninth to sixteenth data 9' to 16', the seventeenth to 24th data 17' to 24', the 25th to 32nd data 25' to 32', and the 33rd to fortieth data 33' to 40' are stored in the first to fifth memory devices 400a to 400e sequentially from the left side. The state of the first to fifth memory devices 400a to 400e state is the same or substantially the same as that shown in FIG. 4D.

The data 1' to 40' may be stored in the same or substantially the same order in the first to fifth memory devices 400a to 400e, whether the data are read by moving the magnetic domains D and the magnetic domain walls DW toward the sixth region R6 as in FIGS. 4A through 4D or by moving the magnetic domains D and the magnetic domain walls DW toward the first region R1 as in FIGS. 5A through 5E. This is because the order of storing the data 1' to 40' in the first to fifth memory devices 400a to 400e may be controlled by the first to fifth selecting logics 500a to 500e. The data 1' to 40' stored in the first to fifth memory devices 400a to 400e may be output to another device (not shown), for example, a central processing unit (CPU) in a sector unit.

After a series of data is stored in the first to fifth memory devices 400a to 400e, a signal (e.g., writing current) corresponding to the series of data may be sent to the first to fifth reading/writing units 300a to 300e to perform write operation while moving the magnetic domains D and the magnetic domain walls DW by the bit. In this example, new data (e.g., data corresponding to the series of data) may be written to the magnetic track 100. Even in the write operation, an order of sending the series of data to the first to fifth reading/writing units 300a to 300e may be controlled by the first to fifth selecting logics 500a to 500e. Accordingly, the order of writing data to the magnetic track 100 may be controlled arbitrarily, whether the write operation is performed while moving the magnetic domains D and the magnetic domain walls DW from the first region R1 to the sixth region R6 or from the sixth region R6 to the first region R1.

The same or substantially the same example embodiments of reading and writing methods may apply to the structure as shown in FIG. 3. For example, the above-described reading and writing methods described with reference to FIGS. 4A through 5E may apply to at least one selected magnetic track of the plurality of magnetic tracks 100 of FIG. 3.

Information storage devices according to example embodiments may have a smaller buffer region as compared to conventional information storage devices because of the plurality of reading/writing units 300a to 300e. According to example embodiments, about 80% or more of the magnetic track 100 may be used as an effective storage region. Therefore, information storage devices according to example embodiments may have a higher storage capacity and recording density as compared to conventional information storage devices. In addition, according to example embodiments, simultaneous reading, writing, and/or erasing operations may be performed using the plurality of reading/writing units 300a to 300e, thereby improving the operating speed.

Also, in information storage devices according to example embodiments, the magnetic track 100 may be formed of a hard magnetic material, thereby reducing power consumption and/or increasing a recording density.

The above-described details should be construed as illustrating example embodiments rather than as limiting the scope of the present invention. For example, the structure of FIGS. 1 through 3 may be varied by those skilled in the art. For example, the magnetic track 100 may have horizontal magnetic anisotropy rather than perpendicular magnetic anisotropy, the first and second ferromagnetic layers 4a and 4b of the reading/writing units 300a to 300e may also have the horizontal magnetic anisotropy, and variations of the structure of the reading/writing units 300a to 300e may be made instead of being limited to the structure shown in FIGS. 1 through 3.

While example embodiments have been particularly shown and described with reference to the example embodiments shown in the drawings, it will be understood by one of ordinary skill in the art that various changes in form and details may be made therein without departing from the spirit and scope of the invention as defined by the appended claims.

What is claimed is:

1. An information storage device comprising:
   a first magnetic track having a plurality of magnetic domains and magnetic domain walls arranged alternately;
   a current supply unit configured to apply current to the first magnetic track;
   a first plurality of reading/writing units arranged on the first magnetic track; and
   a plurality of storage units, each of the plurality of storage units being connected to a corresponding one of the first plurality of reading/writing units, each of the plurality of storage units being configured to temporarily store data to be written or read by the first plurality of reading/writing units.

2. The information storage device of claim 1, wherein the first plurality of reading/writing units are spaced apart from one another at the same interval.

3. The information storage device of claim 1, wherein each of the plurality of storage units includes:
   a selecting logic connected to a reading/writing unit, and
   a memory device connected to the selecting logic.

4. The information storage device of claim 1, further comprising:
   a plurality of signal converters, each of the plurality of signal converters being arranged between a reading/writing unit and corresponding storage unit.

5. The information storage device of claim 1, further comprising:
   a controller configured to store position information for magnetic domains moved by the current supply unit.

6. The information storage device of claim 1, wherein each reading/writing unit includes,
   a first pinned ferromagnetic layer formed on a lower surface of the magnetic track,
   a first insulating layer interposed between the first pinned ferromagnetic layer and the lower surface of the magnetic track,
   a second pinned ferromagnetic layer formed on an upper surface of the magnetic track, the first and second ferromagnetic layers having opposite magnetization directions, and
   a second insulating layer interposed between the second pinned ferromagnetic layer and the upper surface of the magnetic track.

7. The information storage device of claim 1, further comprising:
   at least one second magnetic track having a plurality of magnetic domains and magnetic domain walls arranged alternately; and
   a second plurality of reading/writing units arranged on each of the at least one second magnetic tracks.

8. The information storage device of claim 7, wherein each of the plurality of storage units is connected to reading/writing units arranged on at least two magnetic tracks.

9. The information storage device of claim 7, wherein the current supply unit is connected to at least two magnetic tracks.

10. A method for operating an information storage device including a first magnetic track having a plurality of magnetic domains and magnetic domain walls arranged alternately, a current supply unit configured to apply current to the first magnetic track, a first plurality of reading/writing units arranged on the first magnetic track, and a plurality of storage units, each of the plurality of storage units being connected to a corresponding reading/writing unit, and each of the plurality of storing units storing data temporarily, the method comprising:
   applying current to at least one of a reading/writing unit and the first magnetic track.

11. The method of claim 10, wherein the current is one of writing current, reading current, and current for moving the magnetic domains and magnetic domain walls.

12. The method of claim 10, wherein the first plurality of reading/writing units include N reading/writing units spaced apart by the same interval, the magnetic track being divided into N+1 regions by the first plurality of reading/writing units, wherein
   N is an integer.

13. The method of claim 12, further comprising:
   performing a read operation or write operation using the first plurality of reading/writing units while moving magnetic domains in the first to N-th regions of the N+1 regions toward the second to (N+1)-th regions, respectively.

14. The method of claim 13, wherein in the read operation, data read by the first plurality of reading/writing units are stored in corresponding storage units.

15. The method of claim 13, further comprising:
   storing, in at least one storage unit, data to be written to the magnetic track prior to performing the write operation; wherein the write operation further includes,
   sending a signal corresponding to the data stored in the at least one storage unit to the reading/writing unit.

16. The method of claim 12, further comprising:
   performing a read operation or write operation using the first plurality of reading/writing units while moving the magnetic domains in the second to (N+1)-th regions toward the first to N-th regions, respectively.

17. The method of claim 16, wherein in the read operation, data read by the first plurality of reading/writing units are stored in corresponding storage units.

18. The method of claim 16, further comprising:
   storing, in at least one storage unit, data to be written to the magnetic track prior to performing the write operation; wherein the write operation further includes,
   sending a signal corresponding to the data stored in the at least one storage unit to the reading/writing unit.

19. The method of claim 12, further comprising:
   performing a first read operation or first write operation using the first plurality of reading/writing units while moving magnetic domains in the first to N-th regions of the N+1 regions toward the second to (N+1)-th regions, respectively; and
   performing a second read operation or second write operation using the first plurality of reading/writing units while moving the magnetic domains from the second to (N+1)-th regions toward the first to N-th regions, respectively; wherein
      in the first or second read operation, data read by the first plurality of reading/writing units are stored in corresponding storage units, and
      an order of data stored in the storage units by the first read operation is the same as an order of data stored in the storage units by the second read operation.

20. The method of claim 10, wherein the storage unit includes a selecting logic connected to each reading/writing unit, and a memory device connected to the selecting logic.

21. The method of claim 10, wherein the information storage device further includes a signal converter arranged between each reading/writing unit and corresponding storage unit.

22. The method of claim 10, further comprising:
   storing, at a controller, position information of the magnetic domains moved by the current supply unit.

23. The method of claim 10, wherein the information storage device further includes at least one second magnetic track having a plurality of magnetic domains and magnetic domain walls arranged alternately, and a second plurality of reading/writing units arranged on each of the at least one second magnetic tracks, the method further comprising:
   applying current to each of the first and at least one second magnetic tracks.

24. The method of claim 23, wherein each of the plurality of storage units is connected to corresponding reading/writing units arranged on at least two magnetic tracks.

25. The method of claim 23, wherein the current supply unit is connected to at least two magnetic tracks.

* * * * *